United States Patent [19]

Hatakeyama

[11] Patent Number: 5,761,151
[45] Date of Patent: Jun. 2, 1998

[54] PULSE GENERATOR FOR GENERATING A PLURALITY OF OUTPUT PULSES IN RESPONSE TO AN INPUT PULSE

[75] Inventor: Atsushi Hatakeyama, Kawasaki, Japan

[73] Assignee: Fujitsu Limited, Kawasaki, Japan

[21] Appl. No.: 845,922

[22] Filed: Apr. 28, 1997

[30] Foreign Application Priority Data

Dec. 17, 1996 [JP] Japan ................ 8-337152

[51] Int. Cl.[6] ................................................ G11C 8/00
[52] U.S. Cl. .................... 365/233.5; 365/194; 327/291; 327/295
[58] Field of Search ................ 365/233.5, 233, 365/194, 191, 189.08; 327/291, 295, 299

[56] References Cited

U.S. PATENT DOCUMENTS

| | | | |
|---|---|---|---|
| 4,272,832 | 6/1981 | Ito | 365/233 |
| 4,638,256 | 1/1987 | Hong et al. | 327/297 |
| 5,059,818 | 10/1991 | Witt et al. | 327/291 |
| 5,079,440 | 1/1992 | Robert et al. | 327/217 |
| 5,087,835 | 2/1992 | Hattangadi | 327/291 |
| 5,270,580 | 12/1993 | Nguyen | 327/295 |
| 5,566,129 | 10/1996 | Nakashima et al. | 365/233.5 |

*Primary Examiner*—Tan T. Nguyen
*Attorney, Agent, or Firm*—Nikaido, Marmelstein Murray & Oram LLP

[57] ABSTRACT

A pulse generator generates a plurality of output pulses in response to an input pulse. The pulse generator has a pulse-to-edge conversion circuit, a delay circuit, an edge-to-pulse conversion circuit, and a signal synthesizing circuit. The pulse-to-edge conversion circuit converts a level change in the input pulse into an edge signal that shows a change from a first state to a second state. The delay circuit delays the edge signal by a predetermined time. The edge-to-pulse conversion circuit converts the delayed edge signal into a pulse signal. The signal synthesizing circuit synthesizes the output pulses from the pulse signal and the input pulse. Therefore, the pulse generator can be made of a small number of circuit elements, to reduce power consumption and an area to occupy.

23 Claims, 13 Drawing Sheets

PULSE GENERATOR FOR GENERATING A PLURALITY OF OUTPUT PULSES IN RESPONSE TO AN INPUT PULSE

BACKGROUND OF THE INVENTION

1. Field of the Invention

The present invention relates to a pulse generator and a semiconductor memory, and more particularly, to a pulse generator for generating a plurality of pulses in response to an input pulse and a semiconductor memory employing the pulse generator.

2. Description of the Related Art

Recently, pulse generators that generate a plurality of pulses in response to an input pulse are used for semiconductor devices. For example, the pulse generator generates two output pulses in response to an input pulse. Note that a delay time produced by the delay stages is equal to an interval between the two pulses in the output signal, and the delay time must be longer than a pulse width of the input signal. In order to reduce the number of circuit elements, or the number of the delay stages of the pulse generator, the resistance or capacitance of each delay stage must be increased.

However, the resistance or capacitance of any delay stage must not be increased excessively, i.e., the delay time of any delay stage must not be extended too long, or a pulse in the input signal will collapse and disappear while it is being passed through the delay stages.

Accordingly, to extend the output pulse interval with respect to the input pulse width, the number of delay stages must be increased. This results in increasing the area and power consumption of the pulse generator.

A prior art pulse generator and its associated problems will be described in detail later with reference to drawing.

SUMMARY OF THE INVENTION

An object of the present invention is to provide a pulse generator having a small number of circuit elements to reduce power consumption and an area to occupy.

According to the present invention, there is provided a pulse generator for generating a plurality of output pulses in response to an input pulse, comprising a pulse-to-edge conversion circuit for converting a level change in the input pulse into an edge signal that shows a change from a first state to a second state; a first delay circuit for delaying the edge signal by a predetermined time; an edge-to-pulse conversion circuit for converting the delayed edge signal into a pulse signal; and a signal synthesizing circuit for synthesizing the output pulses from the pulse signal and the input pulse.

According to the present invention, there is also provided a pulse generator for generating a plurality of output pulses in response to an input pulse, comprising a detector for detecting a starting edge of the input pulse to produce an edge signal; a first delay circuit for delaying the edge signal; a pulse signal generator for producing a pulse signal in response to the edge signal; and a signal synthesizing circuit for synthesizing the pulses from the pulse signal and the input pulse to output the plurality of output pulses.

Further, according to the present invention, there is also provided a semiconductor memory having a plurality of word lines, a plurality of bit lines, a plurality of memory cells formed at intersections between the respective word line and the respective bit line, a word decoder for selecting one of the word lines according to a row address signal, a pulse generator for generating output pulses in response to an input pulse, and a high-voltage generator for stepping up a high source voltage in response to the output pulses and supplying the stepped-up voltage to the word decoder, wherein the pulse generator comprising a pulse-to-edge conversion circuit for converting a level change in the input pulse into an edge signal that shows a change from a first state to a second state; a first delay circuit for delaying the edge signal by a predetermined time; an edge-to-pulse conversion circuit for converting the delayed edge signal into a pulse signal; and a signal synthesizing circuit for synthesizing the output pulses from the pulse signal and the input pulse.

The pulse-to-edge conversion circuit may comprise an RS flip-flop. The RS flip-flop may have a set terminal to receive the input pulse and a reset terminal to receive a reset signal. The reset signal may be an inversion signal of an output signal of the first delay circuit.

The edge-to-pulse conversion circuit may convert a falling edge of an output signal of the first delay circuit into the pulse signal, and the number of the output pulses generated according to the input pulse may be two. The edge-to-pulse conversion circuit may convert a rising edge of an output signal of the first delay circuit into the pulse signal, and the number of the output pulses generated according to the input pulse may be two. The edge-to-pulse conversion circuit may comprise a first edge-to-pulse conversion circuit for converting a falling edge of an output signal of the first delay circuit into a pulse signal; and a second edge-to-pulse conversion circuit for converting a rising edge of the output signal of the first delay circuit into a pulse signal, and wherein the number of the output pulses generated according to the input pulse is three.

The edge-to-pulse conversion circuits may comprise an inverter for inverting the output signal of the first delay circuit; a second delay circuit for delaying an output signal of the inverter by a predetermined time; and one of NAND and NOR gates for synthesizing the pulse signal from the output signal of the first delay circuit and an output signal of the second delay circuit.

The input pulse may be provided by a clock generator that receives control signals. The high-voltage generator may carry out a step-up operation in response to each of the output pulses.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

Figure 1:
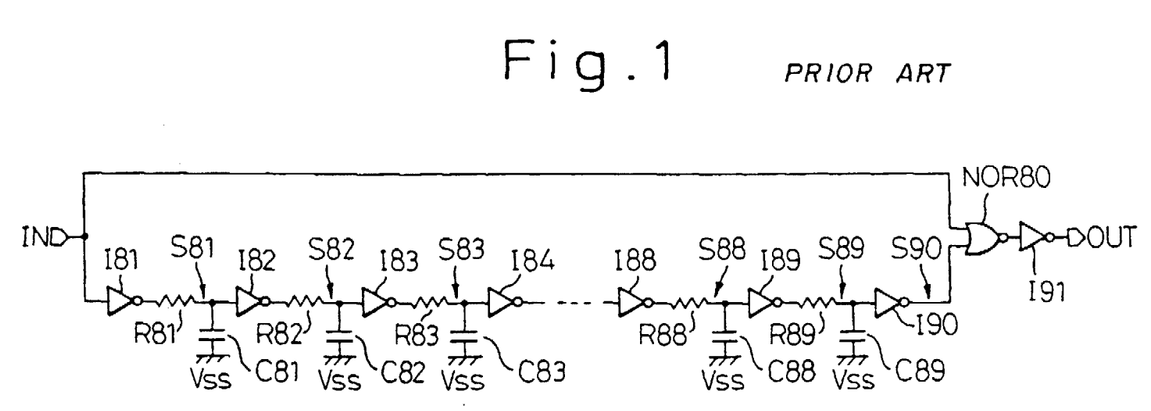
FIG. 1 is a circuit diagram showing an example of a pulse generator according to a prior art.
Figure 2:
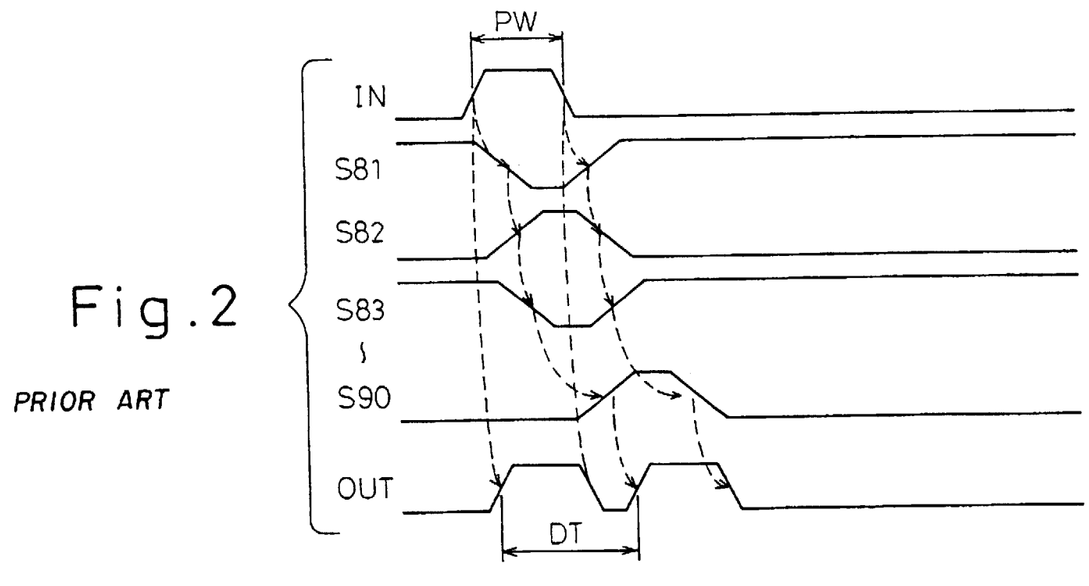
FIG. 2 is a timing chart showing an operation of the pulse generator of FIG. 1.

For a better understanding of the preferred embodiments of the present invention, a pulse generator according to the prior art and the problem thereof will be explained with reference to FIGS. 1 and 2.

This pulse generator generates two output pulses in response to an input pulse. The pulse generator has inverters I81 to I91, resistors R81 to R89, capacitors C81 to C89, and a NOR gate NOR80. The inverters I81 to I90 and resistors R81 to R89 are cascaded alternately. The capacitors C81 to C89 are connected to respective nodes between the resistors R81 to R89 and the inverters I82 to I90 and to a ground line Vss.

The inverter I81, resistor R81, and capacitor C81 form a first delay stage to invert and delay an input signal IN and provide a signal S81. The inverter I82, resistor R82, and capacitor C82 form a second delay stage to invert and delay the signal S81 and provide a signal S82. In this way, the pulse generator incorporates several delay stages. The inverter I90 is arranged to adjust a signal logic.

The NOR gate NOR80 provides a NOR of the input signal IN and a signal S90, which is a positive logic signal formed by delaying the input signal IN. The inverter I91 inverts the output of the NOR gate and provides two pulses in an output signal OUT. Namely, the pulse generator generates two pulses in the output signal OUT according to a pulse in the input signal IN.

A delay time DT (FIG. 2) produced by the delay stages is equal to an interval between the two pulses in the output signal OUT. The delay time DT must be longer than a pulse width PW of the input signal IN.

To reduce the number of circuit elements, or the number of the delay stages of the pulse generator, the resistance or capacitance of each delay stage must be increased.

However, the resistance or capacitance of any delay stage must not be increased excessively, i.e., the delay time of any delay stage must not be extended too long, or a pulse in the input signal IN will collapse and disappear while it is being passed through the delay stages.

Accordingly, to extend the output pulse interval DT with respect to the input pulse width PW, the number of delay stages must be increased. This results in increasing the area and power consumption of the pulse generator.

Next, preferred embodiments of the present invention will be explained.

Figure 3:
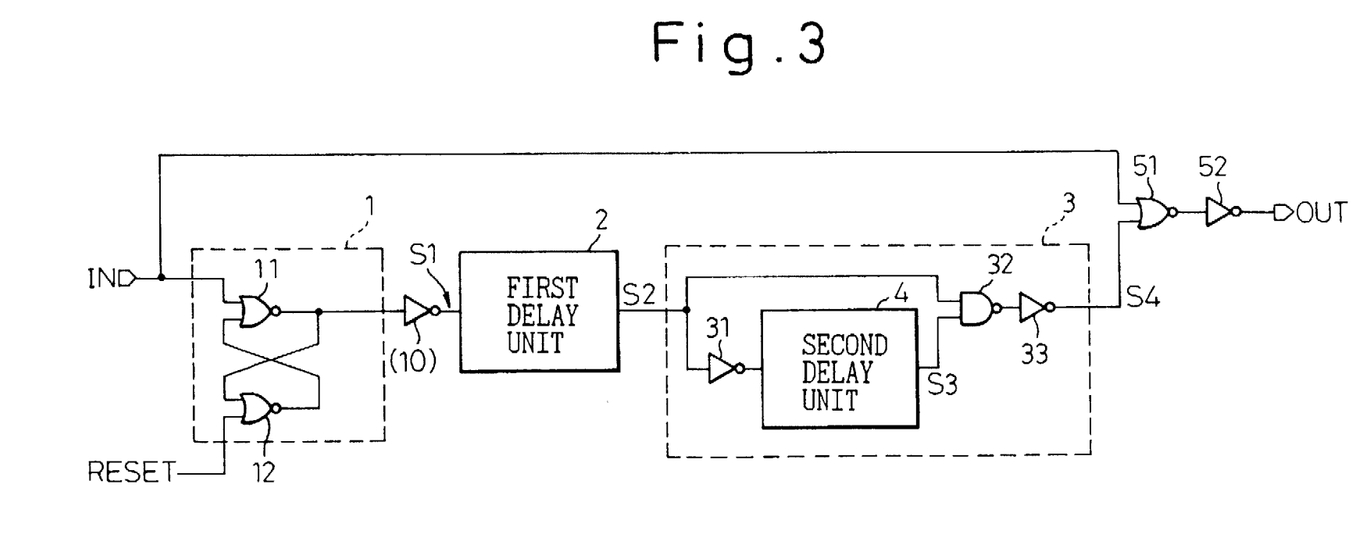
FIG. 3 is a diagram showing a principle configuration of a pulse generator according to the present invention.
Figure 4:
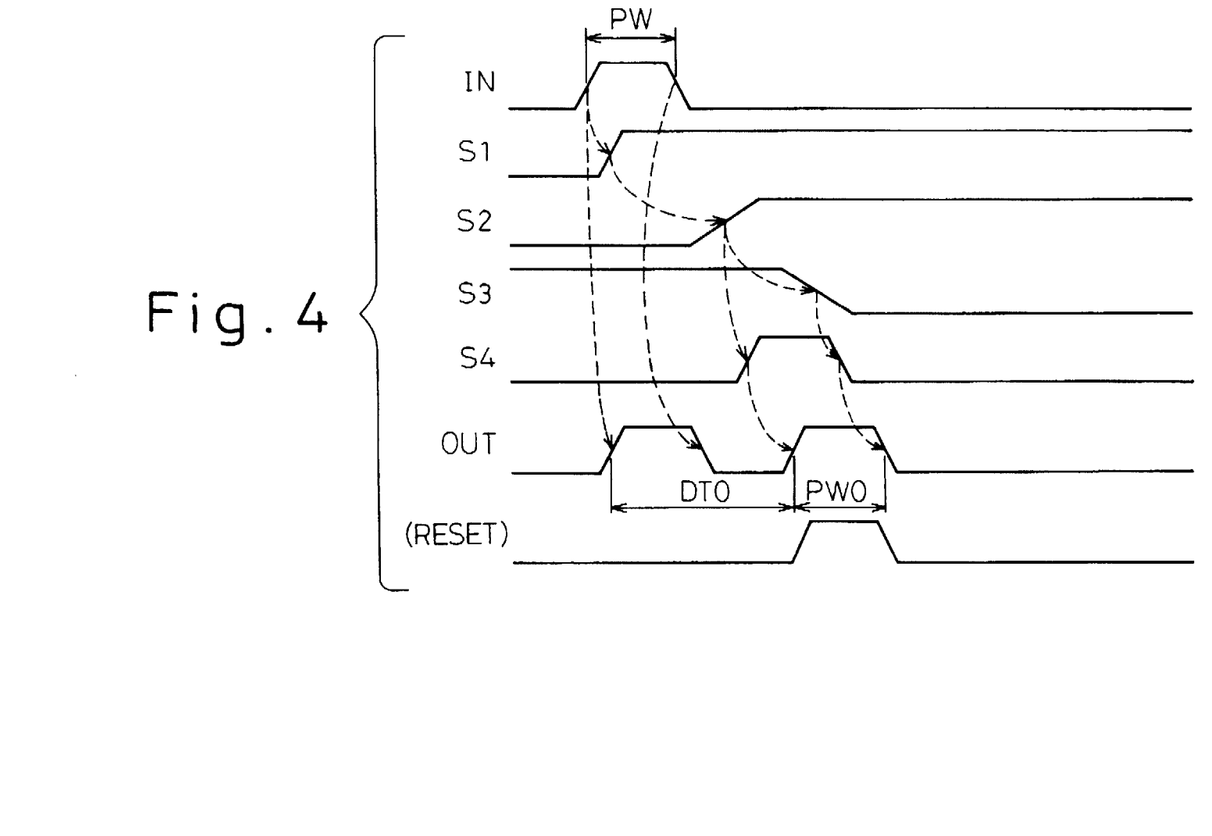
FIG. 4 is a timing chart showing an operation of the pulse generator of FIG. 3.

FIG. 3 shows the principle of a pulse generator according to the present invention, and FIG. 4 shows the operation thereof. The pulse generator has a pulse-to-edge converter 1, a first delay unit 2, and an edge-to-pulse converter 3.

The pulse-to-edge converter 1 is an RS flip-flop consisting of two NOR gates 11 and 12. The RS flip-flop has a set terminal for receiving an input signal IN and a reset terminal for receiving a reset signal.

An inverter 10 inverts the output of the pulse-to-edge converter 1 and provides a signal S1 to the delay unit 2. More precisely, the pulse-to-edge converter 1 forms a falling edge signal from a pulse contained in the input signal IN, and the inverter 10 inverts the falling edge signal into the rising edge signal S1, which is supplied to the delay unit 2.

The delay unit 2 delays the signal S1 and provides a signal S2, which is converted by the edge-to-pulse converter 3 into a pulse signal S4. The edge-to-pulse converter 3 consists of inverters 31 and 33, a NAND gate 32, and a second delay unit 4. The edge-to-pulse converter 3 forms the pulse signal S4 from a rising edge of the signal S2. The pulse signal S4 serves as a second pulse in an output signal OUT.

The inverter 31 inverts the signal S2 and provides the inverted signal to the delay unit 4, which provides a signal S3. The NAND gate 32 provides a NAND of the signals S2 and S3. The inverter 33 inverts the output of the NAND gate 32 into the signal S4.

A NOR gate 51 serving as a signal synthesizer provides a NOR of the signals IN and S4. An inverter 52 inverts the output of the NOR gate 51 and provides the output signal OUT.

In this way, the pulse-to-edge converter 1 converts a pulse of the input signal IN into the edge signal S1 that includes a single change. The signal S1 is delayed by the delay unit 2 and is converted into a pulse signal by the edge-to-pulse converter 3. The output of the edge-to-pulse converter 3 is combined with the input signal IN into the output signal OUT.

A pulse interval DT0 between the two pulses of the output signal OUT is determined by the delay time of the delay unit 2. A pulse width PW0 of the second pulse in the output signal OUT, i.e., the output of the edge-to-pulse converter 3 is determined by the delay time of the delay unit 4. It is preferable to substantially equalize the pulse width PW0 with a pulse width PW of the input signal IN. The pulse interval DT0 must be longer than the pulse width PW.

To extend the pulse interval DT0, the present invention extends the delay time of the delay unit 2. Unlike the prior art of FIGS. 1 and 2, the present invention transfers an edge instead of a pulse, and therefore, can freely extend the delay time of any delay stage without increasing the number of delay stages, power consumption, or an area to occupy.

A reset signal (FIG. 4) is defined so that it rises after a rise of the signal S2 provided by the delay unit 2 and falls before a rise of the next pulse of the input signal IN. The second pulse of the input signal IN and changes caused by the reset signal are not shown in FIG. 4. The level of each pulse of the input signal IN and the logic gates in the pulse generator may be modified in various ways. For example, the input signal IN may be composed of low-level pulses. In this case, the pulse-to-edge converter 1 is an RS flip-flop consisting of two NAND gates.

Figure 5:
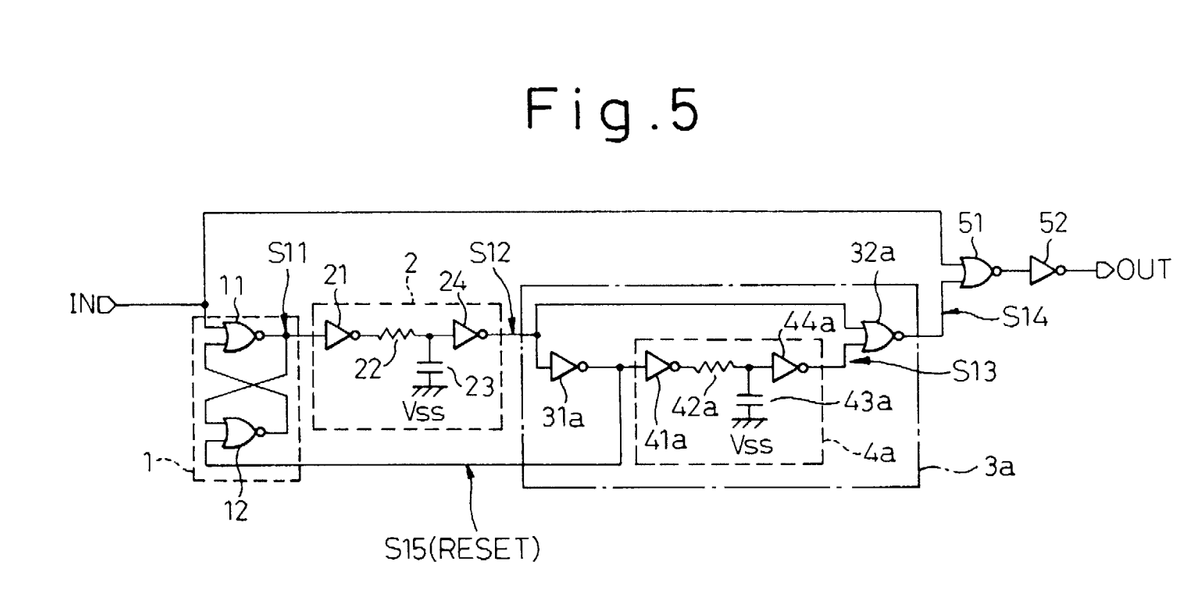
FIG. 5 is a circuit diagram showing a first embodiment of a pulse generator according to the present invention.
Figure 6:
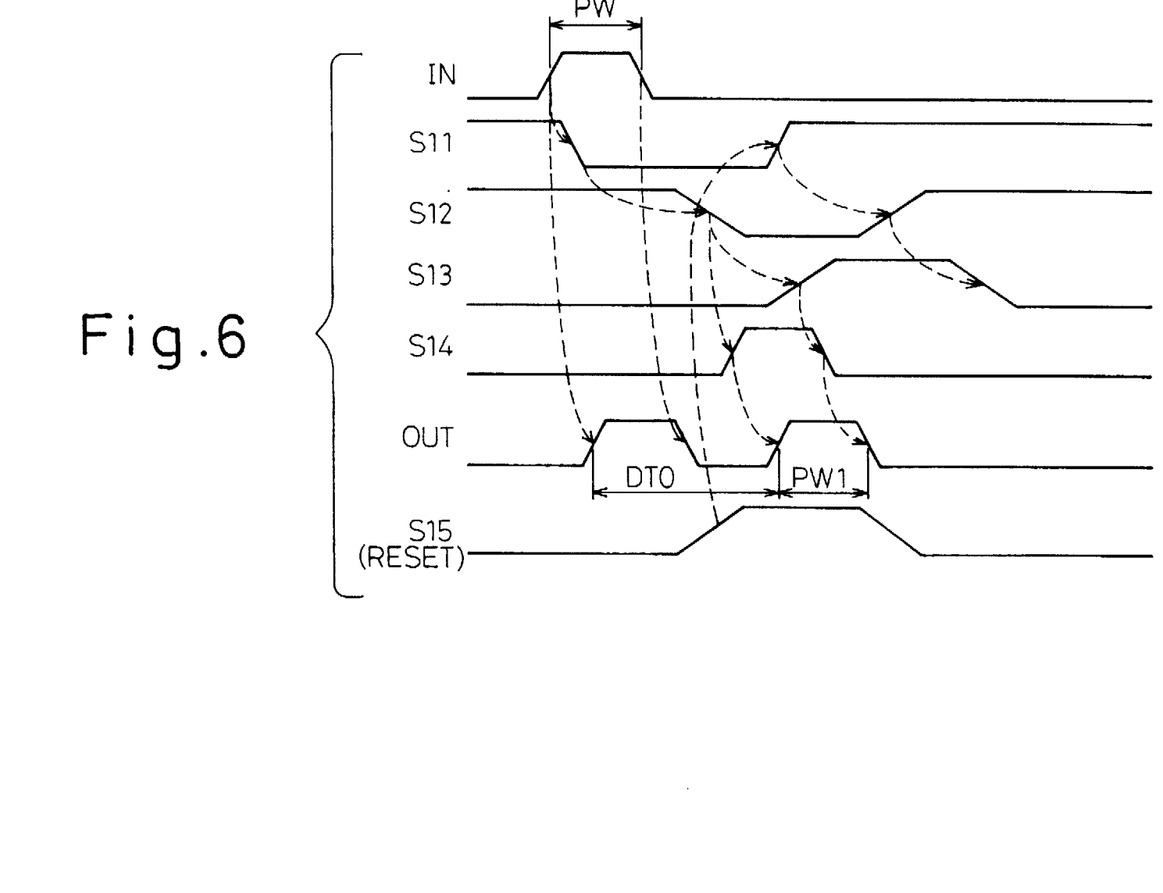
FIG. 6 is a timing chart showing an operation of the pulse generator of FIG. 5.

FIG. 5 shows a pulse generator according to the first embodiment of the present invention, for generating two pulses in response to an input pulse, and FIG. 6 shows the operation of the pulse generator.

The pulse generator is not provided with the inverter 10 of FIG. 3. A first delay unit 2 consists of inverters 21 and 24, a resistor 22, and a capacitor 23. An edge-to-pulse converter 3a consists of an inverter 31a, a NOR gate 32a, and a second delay unit 4a. The delay unit 4a consists of inverters 41a and 44a, a resistor 42a, and a capacitor 43a. A reset signal S15 is the output of the inverter 31a, which inverts an output signal S12 of the delay unit 2.

The delay units 2 and 4a have the same structure. The inverter 21 (41a) receives a signal S11 (S15). The output of the inverter 21 (41a) is passed through the resistor 22 (42a) to the inverter 24 (44a). The capacitor 23 (43a) is connected to a node between the resistor 22 (42a) and the inverter 24 (44a) and to a ground line Vss. The delay units 2 and 4a may have an odd or even number of delay stages.

A pulse-to-edge converter 1 converts a rising edge of a pulse contained in an input signal IN into the edge signal S11, which is delayed by the delay unit 2 and supplied to the edge-to-pulse converter 3a.

The edge-to-pulse converter 3a converts a falling edge of the signal S12 into a pulse signal S14 serving as a second pulse in an output signal OUT. Namely, the NOR gate 32aprovides, as the signal S14, a NOR of the signals S12 and S13 provided by the delay units 2 and 4a. A NOR gate 51 provides a NOR of the signals S14 and IN. An inverter 52 inverts the output of the NOR gate 51 and provides the output signal OUT.

In FIG. 6, the signal S12 is delayed behind the signal S11 and never collapses because the reset signal is based on the output of the delay unit 2. Namely, when the delay time of the delay unit 2 is extended, the reset signal is delayed accordingly.

A pulse interval DT0 between two pulses in the output signal OUT is defined by the delay time of the delay unit 2. A pulse width PW1 of the second pulse in the output signal OUT, i.e., the pulse generated by the edge-to-pulse converter 3a is defined by the delay time of the delay unit 4a.

Figure 7:
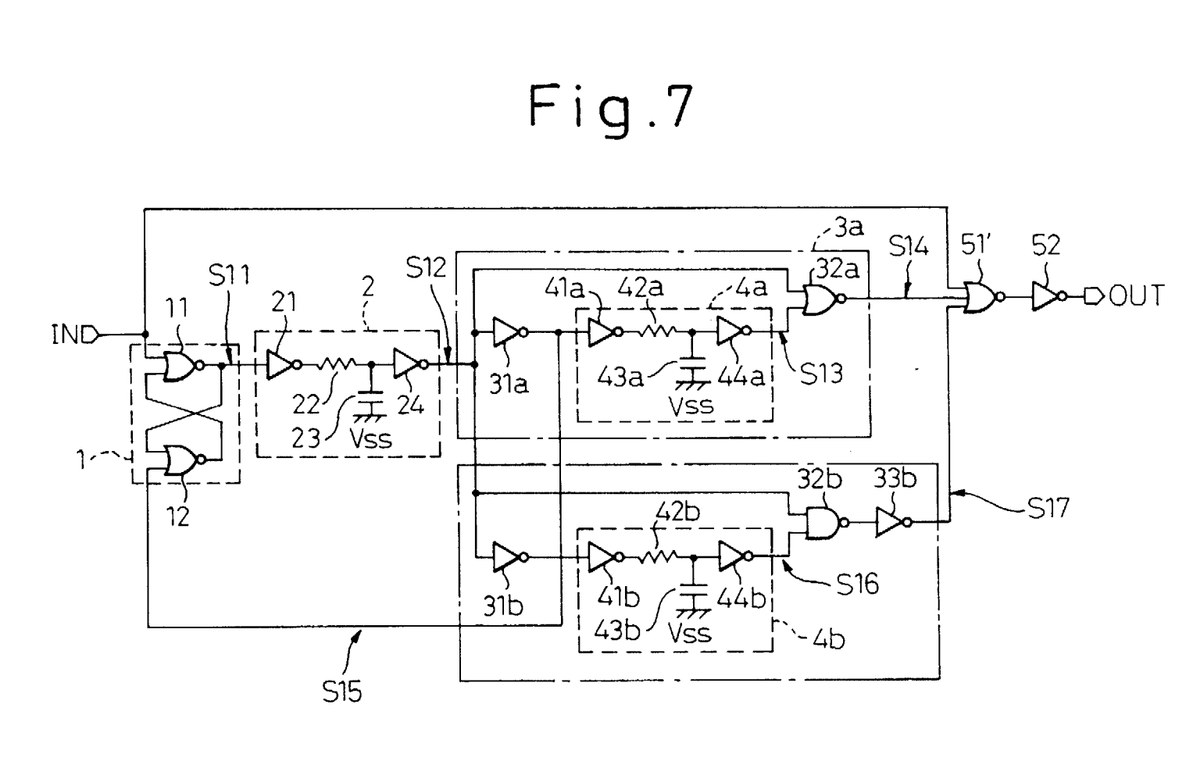
FIG. 7 is a circuit diagram showing a second embodiment of a pulse generator according to the present invention.
Figure 8:
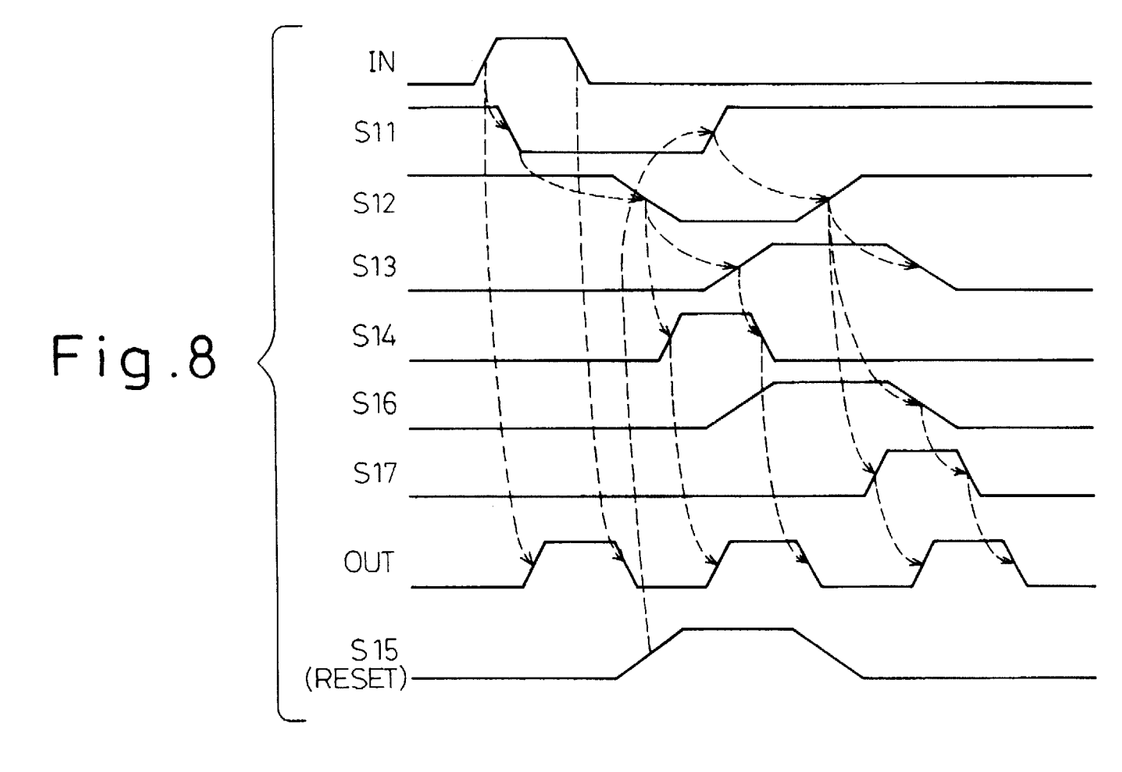
FIG. 8 is a timing chart showing an operation of the pulse generator of FIG. 7.

FIG. 7 shows a pulse generator according to the second embodiment of the present invention, for generating three pulses according to an input pulse, and FIG. 8 shows the operation of the pulse generator.

A first delay unit 2 provides a signal S12, which is supplied to two edge-to-pulse converters 3a and 3b. The converters 3a and 3b provide signals S14 and S17. A NOR gate 51' provides a NOR of the signals S14 and S17 and an input signal IN. An inverter 52 inverts the output of the NOR gate 51' and provides an output signal OUT.

The edge-to-pulse converter 3a is identical to that of FIG. 5, and the edge-to-pulse converter 3b corresponds to the converter 3 of FIG. 3. The converter 3a consists of an inverter 31a, a NOR gate 32a, and a delay unit 4a. The converter 3b consists of inverters 31b and 33b, a NAND gate 32b, and a delay unit 4b. The delay unit 4a (4b) consists of inverters 41a and 44a (41b, 44b), a resistor 42a (42b), and a capacitor 43a (43b). A reset signal S15 is the output of the inverter 31a.

The pulse generator generates three pulses in response to an input pulse. A pulse-to-edge converter 1 is an RS flip-flop, which converts a rising edge of a pulse in the input signal IN into a falling edge of a signal S11. The signal S11 is delayed by the delay unit 2 into the signal S12, which is supplied to the edge-to-pulse converters 3a and 3b. A rising edge of the signal S11 is defined by a rising edge of the reset signal S15 supplied to the RS flip-flop 1.

The edge-to-pulse converter 3a converts a falling edge of the signal S12 into the pulse signal S14 that serves as a second pulse of the output signal OUT. The edge-to-pulse converter 3b converts a rising edge of the signal S12 into the pulse signal S17 that serves as a third pulse of the output signal OUT. The signals S12, S16, and S17 of the edge-to-pulse converter 3b correspond to the signals S2, S3, and S4 of the edge-to-pulse converter 3 of FIGS. 3 and 4.

The NOR gate 51' provides a NOR of the signals S14, S17, and IN. The output of the NOR gate 51' is inverted by the inverter 52, which provides the output signal OUT.

Figure 9:
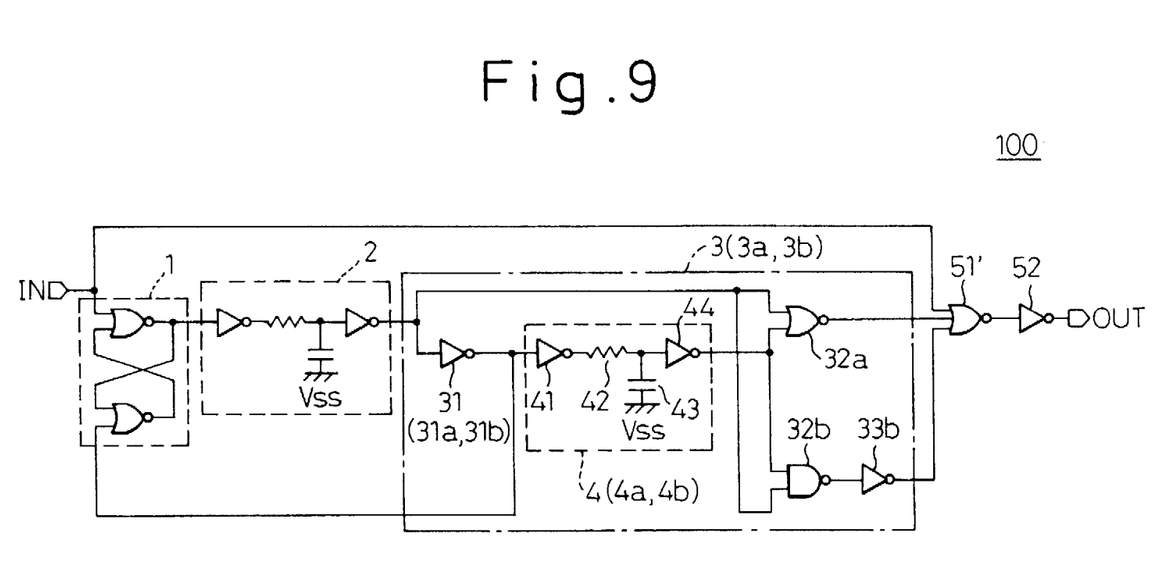
FIG. 9 is a circuit diagram showing a third embodiment of a pulse generator according to the present invention.

FIG. 9 shows a pulse generator according to the third embodiment of the present invention.

The pulse generator 100 is a simplified form of the pulse generator of FIG. 7 and is realized by sharing some parts of the pulse generator of FIG. 7. Namely, the pulse generator 100 has an inverter 31 that works as the inverters 31a and 31b of FIG. 7 and a delay unit 4 that works as the delay units 4a and 4b of FIG. 7. The pulse generator 100 reduces the number of circuit elements, to drop power consumption and an area to occupy. The operation of the pulse generator 100 is the same as that of the pulse generator of FIG. 7, and therefore, is not explained again.

Figure 10:
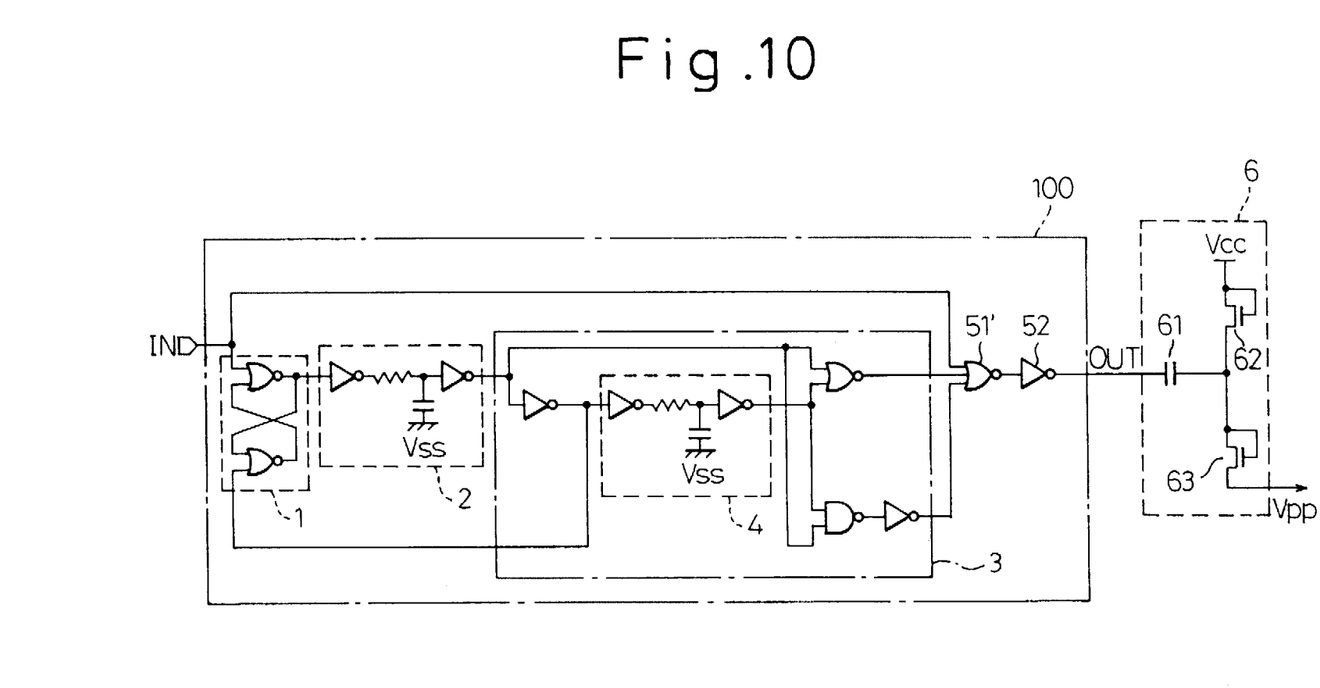
FIG. 10 is a circuit diagram employing the pulse generator of FIG. 9.

FIG. 10 shows a high-voltage generator (charge pump circuit) 6 connected to the pulse generator 100 of FIG. 9.

The charge pump circuit 6 has a capacitor 61 and transistors 62 and 63. In response to pulses in the output signal OUT of the pulse generator 100, charge accumulated at the capacitor 61 is added to a source voltage Vcc of, for example, 3.3 V, to provide a stepped-up voltage Vpp of, for example, 4.0 V.

The pulse generator 100 can generate three pulses in response to each input pulse, to carry out three step-up operations of the charge pump circuit 6. Namely, the output of the pulse generator 100 makes the charge pump circuit 6 provide the stepped-up voltage Vpp three times as frequently as the input signal IN does when it is directly applied to the charge pump circuit 6. This means that the capacitance of the capacitor 61 may be reduced to, for example, one third to make the charge pump circuit 6 smaller.

Figure 11:
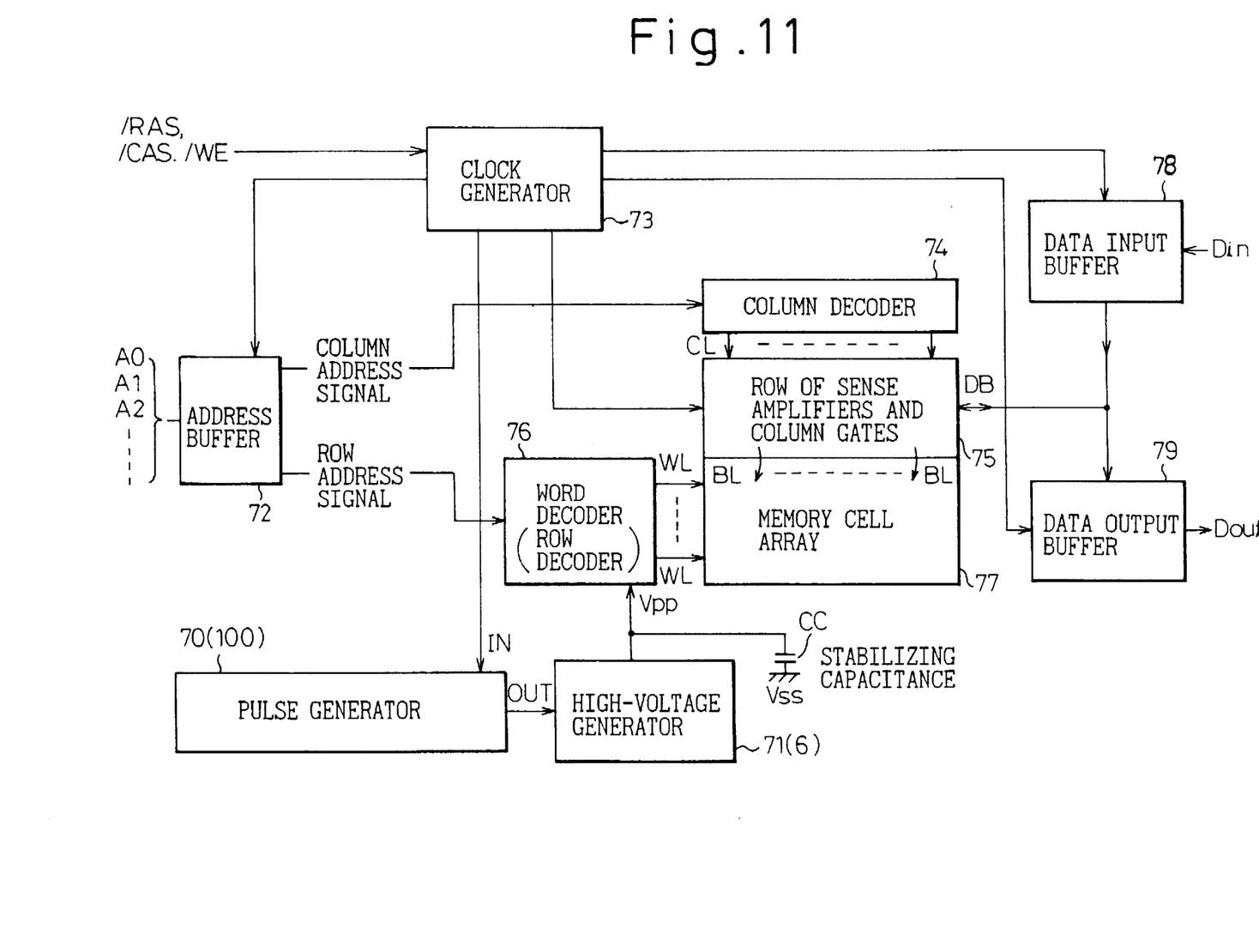
FIG. 11 is a block diagram showing a whole configuration of a semiconductor memory employing the present invention.

FIG. 11 shows a semiconductor memory (DRAM) according to the present invention.

The DRAM has a pulse generator 70, which may be the pulse generator 100 of FIG. 9, a high-voltage generator, which may be the charge pump circuit 6 of FIG. 10, an address buffer 72, a clock generator 73, a column decoder 74, rows 75 of sense amplifiers and column gates, a word decoder (row decoder) 76, a memory cell array 77, a data input buffer 78, and a data output buffer 79. The DRAM handles a row address strobe signal /RAS, a column address strobe signal /CAS, a write enable signal /WE, address signals A0, A1, A2, and the like, input data (write data) Din, and output data (read data) Dout.

Figure 12:
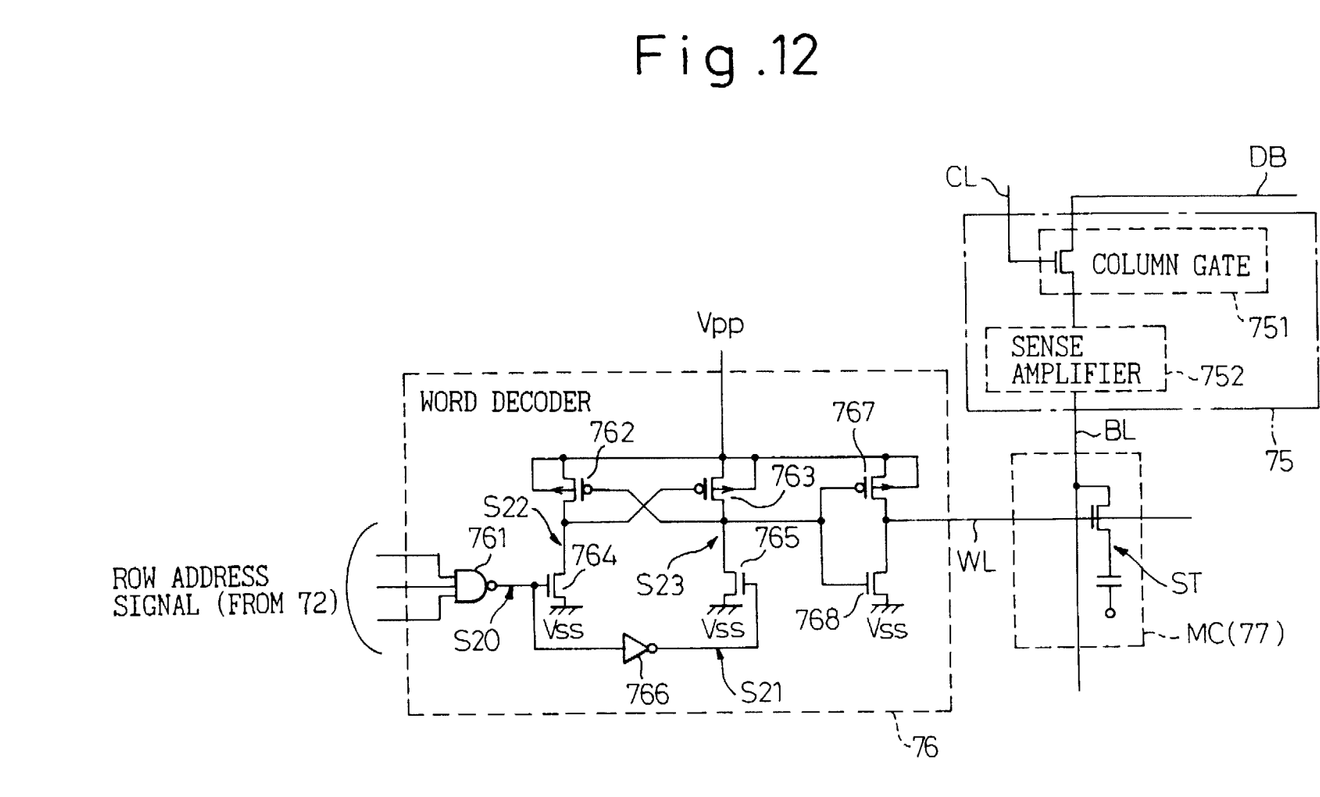
FIG. 12 is a block circuit diagram showing essential parts of the semiconductor memory of FIG. 11.

FIG. 12 shows the details of a part of the DRAM of FIG. 11. The memory cell array 77 consists of word lines WLs, bit lines BLs, and memory cells MCs formed at the intersections between the word and bit lines, respectively. Among these elements, FIG. 12 shows a memory cell MC, a word line WL, and a bit line BL. Also shown in FIG. 12 are a column gate 751 and a sense amplifier 752 contained in the rows 75 of sense amplifiers and column gates, and a part of the word decoder 76.

In FIG. 11, the clock generator 73 receives the signals /RAS, /CAS, and /WE and generates clock signals, which are supplied to the data input buffer 78, data output buffer 79, row 75 of sense amplifiers and column gates, and pulse generator 70. One of the signals generated by the clock generator 73 is an input signal IN that is supplied to the pulse generator 70. If the memory cell MC of FIG. 12 is selected to write data therein, the write data Din is supplied to the data input buffer 78, is passed through the data bus DB, column gate 751, and sense amplifier 752, and is written into the memory cell MC. Data stored in the memory cell MC is read as the read data Dout through the sense amplifier 752, column gate 751, and data bus DB.

The address buffer 72 receives the address signals A0, A1, A2, and the like and provides the column decoder 74 with a column address signal to select one of the bit lines BLs. At the same time, the address buffer 72 provides the word decoder (row decoder) 76 with a row address signal to select one of the word line WLs.

In FIG. 12, the word decoder 76, which is provided for every word line WL, consists of a NAND gate 761 for receiving a row address signal, p-channel MOS transistors 762, 763, and 767, n-channel MOS transistors 764, 765, and 768, and an inverter 766. The sources of the transistors 762, 763, and 767 receive a stepped-up voltage Vpp of, for example, 4.0 V boosted from a high source voltage Vcc, to select the word line WL. The sources of the transistors 764, 765, and 768 receive a low source voltage Vss of, for example, 0 V. On the other hand, the column gate 751 and sense amplifier 752 are provided for each bit line BL, to read, write, and refresh the corresponding memory cell MC.

Figure 13A:
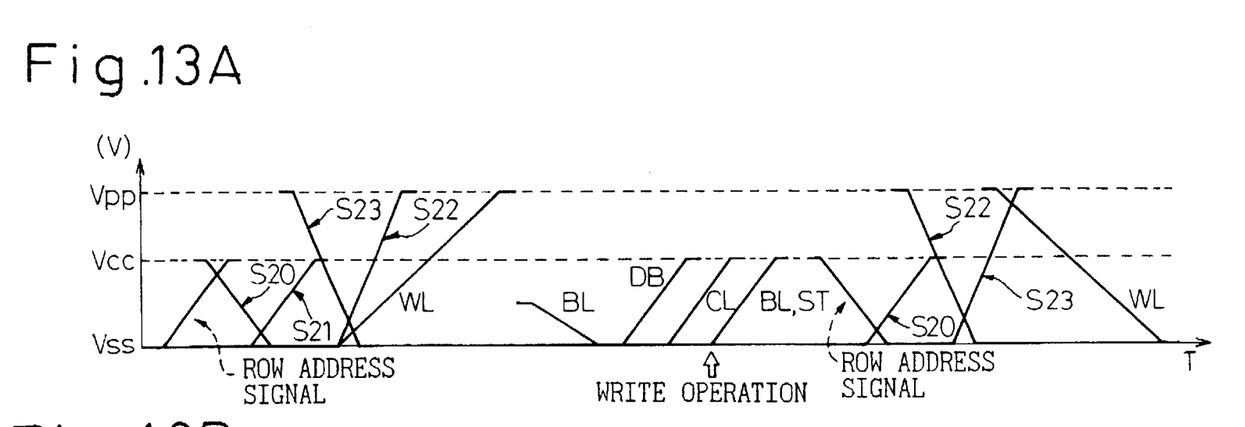
FIGS. 13A, 13B, and 13C are timing charts showing an operation of the semiconductor memory of FIGS. 11 and 12.
Figure 13B:
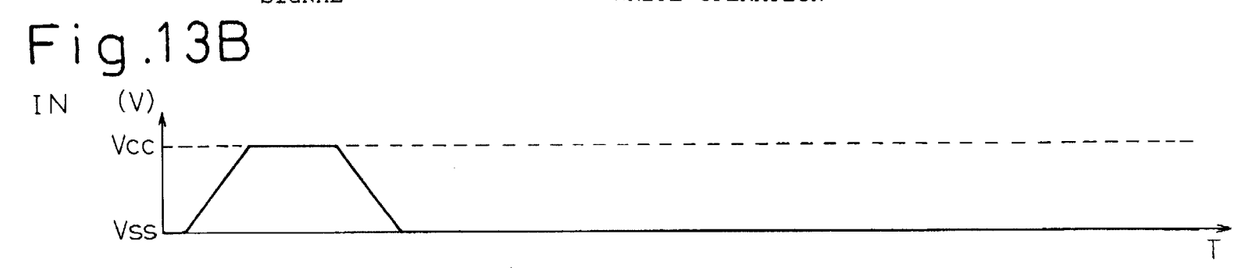
Figure 13C:
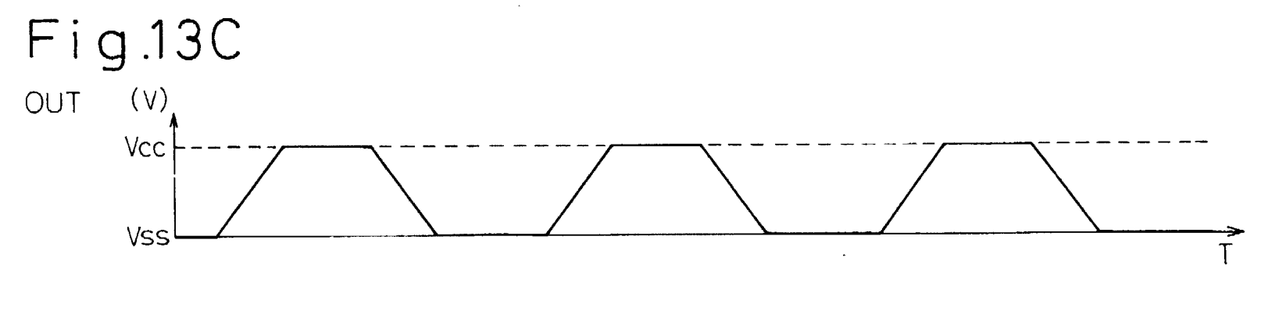

FIGS. 13A, 13B, and 13C show the operation of the DRAM of FIGS. 11 and 12, in which FIG. 13A shows signals shown in FIG. 12, FIG. 13B shows the input signal IN to the pulse generator 70, and FIG. 13C shows an output signal OUT provided by the pulse generator 70.

The pulse generator 70 generates three pulses in the output signal OUT in response to a pulse in the input signal IN.

According to the address signals A0, A1, A2, and the like, the address buffer 72 provides a row address signal. If the row address signal is to select the word line WL of FIG. 12, every bit of the row address signal to the NAND gate 761 is high, and therefore, the NAND gate 761 provides an output signal S20 of low level. The signal S20 is supplied to the gate of the transistor 764 to turn off the transistor 764. At the same time, the signal S20 is inverted by the inverter 766 into a signal S21, which is supplied to the gate of the transistor 765 to turn on the transistor 765. A signal S23 at a node between the transistors 763 and 765 drops from Vpp to Vss, and a signal S22 at a node between the transistors 762 and 764 rises from Vss to Vpp. Then, a signal to the word line WL from an inverter, which consists of the transistors 767 and 768, rises from Vss to Vpp.

The word line WL is thus selected, and the memory cell MC connected to the word line WL provides data to the bit line BL. In FIGS. 13A to 13C, the memory cell MC provides low level data to the bit line BL, to drop the bit line BL from Vcc/2 to Vss. The sense amplifier 752 amplifies the potential of the bit line BL, and the column gate 751 provides the data to the data bus DB. The column gate 751 is selected, i.e., turned on by a column select signal CL, which is provided by the column decoder 74 and rises from Vss to Vcc to turn on the column gate.

To write data to the memory cell MC, write data Din is supplied to the data bus DB. In FIGS. 13A to 13C, the write data Din is high. The column select signal CL rises to Vcc to turn on the column gate 751, and the write data Din is transferred from the data bus DB to the bit line BL. This increases the bit line BL to "Vcc-Vth" where Vcc is the potential of the column select signal CL at this moment and Vth is the threshold voltage of the transistor that forms the column gate 751. The potential of the bit line BL is increased to Vcc by the sense amplifier 752. At this time, the word line WL is at Vpp, where Vpp>Vcc+Vth. When the bit line BL is increased to Vcc, a storage node ST of the memory cell MC is increased to Vcc, to write the data Din of high level into the memory cell MC.

Thereafter, an external precharge command is applied to decrease the row address signal. Then, the output signal S20 of the NAND gate 761 increases to turn on the transistor 764 and off the transistor 765. This results in dropping the signal S22 from Vpp to Vss and increasing the signal S23 from Vss to Vpp, thereby dropping the potential of the word line WL to Vss. Namely, the word decoder 76 is reset, and the word line WL is disabled.

Accessing a word line, i.e., increasing the potential of the word line to Vpp is achieved by consuming the output Vpp of the high-voltage generator 71. Accordingly, the high-voltage generator 71 must be recharged until the next access to any word line is carried out. To charge the high-voltage generator 71, output pulses of FIG. 13C of the pulse generator 70 are used. When the clock generator 73 provides the pulse generator 70 with a pulse in the input signal IN, the pulse generator 70 generates three pulses in signal OUT for the high-voltage generator 71. Namely, each input pulse to the pulse generator 70 can produce three step-up operations of the high-voltage generator 71 to sufficiently provide the stepped-up voltage Vpp.

The pulse generator of the present invention is applicable not only to the high-voltage generator of the DRAM but also to a variety of circuits.

In summary, the present invention forms a pulse generator with a pulse-to-edge converter, a delay unit, an edge-to-pulse generator, and a signal synthesizer, to reduce the number of circuit elements, power consumption, and an area to occupy.

Many different embodiments of the present invention may be constructed without departing from the spirit and scope of the present invention, and it should be understood that the present invention is not limited to the specific embodiments described in this specification, except as defined in the appended claims.

What is claimed is:

1. A pulse generator for generating a plurality of output pulses in response to an input pulse, comprising:
 a pulse-to-edge conversion circuit for converting a level change in the input pulse into an edge signal that shows a change from a first state to a second state;
 a first delay circuit for delaying the edge signal by a predetermined time;
 an edge-to-pulse conversion circuit for converting the delayed edge signal into a pulse signal; and
 a signal synthesizing circuit for synthesizing the output pulses from the pulse signal and the input pulse.

2. A pulse generator as claimed in claim 1, wherein said pulse-to-edge conversion circuit comprises an RS flip-flop.

3. A pulse generator as claimed in claim 2, wherein said RS flip-flop has a set terminal to receive the input pulse and a reset terminal to receive a reset signal.

4. A pulse generator as claimed in claim 3, wherein the reset signal is an inversion signal of an output signal of said first delay circuit.

5. A pulse generator as claimed in claim 1, wherein said edge-to-pulse conversion circuit converts a falling edge of an output signal of said first delay circuit into the pulse signal, and the number of the output pulses generated according to the input pulse is two.

6. A pulse generator as claimed in claim 5, wherein said edge-to-pulse conversion circuit comprises:
 an inverter for inverting the output signal of said first delay circuit;
 a second delay circuit for delaying an output signal of said inverter by a predetermined time; and
 one of NAND and NOR gates for synthesizing the pulse signal from the output signal of said first delay circuit and an output signal of said second delay circuit.

7. A pulse generator as claimed in claim 1, wherein said edge-to-pulse conversion circuit converts a rising edge of an output signal of said first delay circuit into the pulse signal, and the number of the output pulses generated according to the input pulse is two.

8. A pulse generator as claimed in claim 7, wherein said edge-to-pulse conversion circuit comprises:

an inverter for inverting the output signal of said first delay circuit;

a second delay circuit for delaying an output signal of said inverter by a predetermined time; and one of NAND and NOR gates for synthesizing the pulse signal from the output signal of said first delay circuit and an output signal of said second delay circuit.

9. A pulse generator as claimed in claim 1, wherein said edge-to-pulse conversion circuit comprises:

a first edge-to-pulse conversion circuit for converting a falling edge of an output signal of said first delay circuit into a pulse signal; and a second edge-to-pulse conversion circuit for converting a rising edge of the output signal of said first delay circuit into a pulse signal, and wherein the number of the output pulses generated according to the input pulse is three.

10. A pulse generator as claimed in claim 9, wherein each of said first and second edge-to-pulse conversion circuits comprises:

an inverter for inverting the output signal of said first delay circuit;

a second delay circuit for delaying an output signal of said inverter by a predetermined time; and one of NAND and NOR gates for synthesizing the pulse signal from the output signal of said first delay circuit and an output signal of said second delay circuit.

11. A pulse generator for generating a plurality of output pulses in response to an input pulse, comprising:

a detector for detecting a starting edge of said input pulse to produce an edge signal;

a first delay circuit for delaying the edge signal;

a pulse signal generator for producing a pulse signal in response to said edge signal; and a signal synthesizing circuit for synthesizing the pulses from the pulse signal and the input pulse to output the plurality of output pulses.

12. A semiconductor memory having a plurality of word lines, a plurality of bit lines, a plurality of memory cells formed at intersections between said respective word line and said respective bit line, a word decoder for selecting one of said word lines according to a row address signal, a pulse generator for generating output pulses in response to an input pulse, and a high-voltage generator for stepping up a high source voltage in response to the output pulses and supplying the stepped-up voltage to said word decoder, wherein said pulse generator comprising:

a pulse-to-edge conversion circuit for converting a level change in the input pulse into an edge signal that shows a change from a first state to a second state;

a first delay circuit for delaying the edge signal by a predetermined time;

an edge-to-pulse conversion circuit for converting the delayed edge signal into a pulse signal; and a signal synthesizing circuit for synthesizing the output pulses from the pulse signal and the input pulse.

13. A semiconductor memory as claimed in claim 12, wherein said pulse-to-edge conversion circuit comprises an RS flip-flop.

14. A semiconductor memory as claimed in claim 13, wherein said RS flip-flop has a set terminal to receive the input pulse and a reset terminal to receive a reset signal.

15. A semiconductor memory as claimed in claim 14, wherein the reset signal is an inversion signal of an output signal of said first delay circuit.

16. A semiconductor memory as claimed in claim 12, wherein said edge-to-pulse conversion circuit converts a falling edge of an output signal of said first delay circuit into the pulse signal, and the number of the output pulses generated according to the input pulse is two.

17. A semiconductor memory as claimed in claim 16, wherein said edge-to-pulse conversion circuit comprises:

an inverter for inverting the output signal of said first delay circuit;

a second delay circuit for delaying an output signal of said inverter by a predetermined time; and one of NAND and NOR gates for synthesizing the pulse signal from the output signal of said first delay circuit and an output signal of said second delay circuit.

18. A semiconductor memory as claimed in claim 12, wherein said edge-to-pulse conversion circuit converts a rising edge of an output signal of said first delay circuit into the pulse signal, and the number of the output pulses generated according to the input pulse is two.

19. A semiconductor memory as claimed in claim 18, wherein said edge-to-pulse conversion circuit comprises:

an inverter for inverting the output signal of said first delay circuit;

a second delay circuit for delaying an output signal of said inverter by a predetermined time; and one of NAND and NOR gates for synthesizing the pulse signal from the output signal of said first delay circuit and an output signal of said second delay circuit.

20. A semiconductor memory as claimed in claim 12, wherein said edge-to-pulse conversion circuit comprises:

a first edge-to-pulse conversion circuit for converting a falling edge of an output signal of said first delay circuit into a pulse signal; and a second edge-to-pulse conversion circuit for converting a rising edge of the output signal of said first delay circuit into a pulse signal, and wherein the number of the output pulses generated according to the input pulse is three.

21. A semiconductor memory as claimed in claim 20, wherein each of said first and second edge-to-pulse conversion circuits comprises:

an inverter for inverting the output signal of said first delay circuit;

a second delay circuit for delaying an output signal of said inverter by a predetermined time; and one of NAND and NOR gates for synthesizing the pulse signal from the output signal of said first delay circuit and an output signal of said second delay circuit.

22. A semiconductor memory as claimed in claim 12, wherein the input pulse is provided by a clock generator that receives control signals.

23. A semiconductor memory as claimed in claim 12, wherein said high-voltage generator carries out a step-up operation in response to each of the output pulses.

\* \* \* \* \*